(12) United States Patent
Kishimoto et al.

(10) Patent No.: US 11,746,000 B2
(45) Date of Patent: Sep. 5, 2023

(54) MEMS DEVICE

(71) Applicant: Murata Manufacturing Co., Ltd., Nagaokakyo (JP)

(72) Inventors: Yutaka Kishimoto, Nagaokakyo (JP); Shinsuke Ikeuchi, Nagaokakyo (JP); Katsumi Fujimoto, Nagaokakyo (JP); Tetsuya Kimura, Nagaokakyo (JP); Fumiya Kurokawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 371 days.

(21) Appl. No.: 17/161,724

(22) Filed: Jan. 29, 2021

(65) Prior Publication Data

US 2021/0147217 A1 May 20, 2021

Related U.S. Application Data

(63) Continuation of application No. PCT/JP2019/029845, filed on Jul. 30, 2019.

(30) Foreign Application Priority Data

Jul. 30, 2018 (JP) .................. 2018-142878

(51) Int. Cl.
*B81B 3/00* (2006.01)
*B81B 7/02* (2006.01)

(52) U.S. Cl.
CPC .................. *B81B 3/00* (2013.01); *B81B 7/02* (2013.01); *B81B 2201/0271* (2013.01); *B81B 2203/04* (2013.01)

(58) Field of Classification Search
CPC ..... B81B 3/00; B81B 7/02; B81B 2201/0271; B81B 2203/04; H10N 30/01; H10N 30/2047; B06B 1/0662
See application file for complete search history.

(56) References Cited

U.S. PATENT DOCUMENTS

2007/0007860 A1* 1/2007 Takabe ............... H10N 30/2047
310/366
2009/0058231 A1 3/2009 Matsumoto et al.
(Continued)

FOREIGN PATENT DOCUMENTS

JP 2007-081645 A 3/2007
JP 2009-054786 A 3/2009
(Continued)

OTHER PUBLICATIONS

Official Communication issued in International Patent Application No. PCT/JP2019/029845, dated Oct. 1, 2019.

*Primary Examiner* — Yasser A Abdelaziez
(74) *Attorney, Agent, or Firm* — KEATING & BENNETT, LLP

(57) ABSTRACT

A MEMS device includes a membrane portion, a piezoelectric layer made of a piezoelectric single crystal, a first electrode on a first surface of the piezoelectric layer, a second electrode on a second surface of the piezoelectric layer opposite to the first direction, and a first layer covering the first surface of the piezoelectric layer. At least a portion of the piezoelectric layer is included in the membrane portion. Each of the first electrode and the second electrode has a tapered cross-sectional shape with a width which decreases with increasing distance from the piezoelectric layer on a cross section along a plane vertical to the surface in the first direction.

18 Claims, 4 Drawing Sheets

(56) References Cited

U.S. PATENT DOCUMENTS

2014/0346930 A1* 11/2014 Kohda ................. H03H 9/0519
216/41
2018/0054176 A1* 2/2018 Kim ....................... H10N 30/88

FOREIGN PATENT DOCUMENTS

| JP | 2010-136317 A | 6/2010 |
| JP | 2013-046086 A | 3/2013 |
| JP | 2014-013842 A | 1/2014 |
| JP | 2015-035516 A | 2/2015 |

* cited by examiner

MEMS DEVICE

CROSS REFERENCE TO RELATED APPLICATIONS

This application claims the benefit of priority to Japanese Patent Application No. 2018-142878 filed on Jul. 30, 2018 and is a Continuation Application of PCT Application No. PCT/JP2019/029845 filed on Jul. 30, 2019. The entire contents of each application are hereby incorporated herein by reference.

BACKGROUND OF THE INVENTION

1. Field of the Invention

The present invention relates to a micro electro mechanical systems (MEMS) device.

2. Description of the Related Art

A method of manufacturing a bulk-acoustic-wave device is described in Japanese Unexamined Patent Application Publication No. 2010-136317. The device manufactured therein includes a piezoelectric thin film, a lower electrode film arranged so as to cover the bottom surface of the piezoelectric thin film, and an upper electrode film arranged so as to cover the top surface of the piezoelectric thin film. The lower electrode film is formed by forming a conductive film within a wide range of the surface of a supporting substrate and removing an unnecessary portion.

In the device using a method of sequentially laminating the various layers on the surface of the supporting substrate, the lower electrode film, the piezoelectric thin film, and the upper electrode film may have similar shapes. As a result, the symmetry between the upper and lower structures sandwiching the piezoelectric layer is reduced not to achieve high efficiency of vibration.

SUMMARY OF THE INVENTION

Preferred embodiments of the present invention provide MEMS devices each with increased vibration efficiency.

A MEMS device according to a preferred embodiment of the present invention includes a membrane portion. The MEMS device includes a piezoelectric layer made of a piezoelectric single crystal, a first electrode on a first surface of the piezoelectric layer, a second electrode on a second surface, which is the opposite to the first surface, of the piezoelectric layer, and a first layer covering the first surface in the first direction of the piezoelectric layer. At least a portion of the piezoelectric layer is included in a membrane portion. Each of the first electrode and the second electrode has a tapered cross-sectional shape with a width which decreases with increasing distance from the piezoelectric layer on a cross section along a plane vertical or substantially vertical to the surface in the first direction.

According to preferred embodiments of the present invention, since the symmetry between the shapes of the two electrodes sandwiching the piezoelectric layer in a cross-sectional view is high, the vibration efficiency is increased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
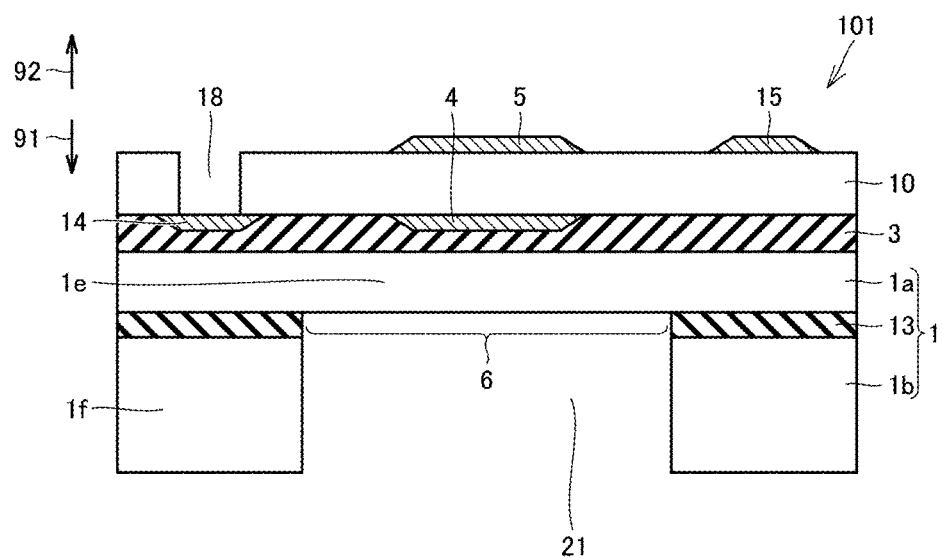
FIG. 1 is a cross-sectional view of a MEMS device according to a first preferred embodiment of the present invention.

Preferred embodiments of the present invention will be described in detail below with reference to the accompanying drawings. The dimensional ratios illustrated in the drawings do not necessarily represent the actual ratios accurately and there are cases in which the dimensional ratios are magnified for convenience. In the following description, the concept of "upper" or "lower" does not necessarily mean the absolute "upper" or "lower" and may mean the relative "upper" or "lower" in the orientation that is illustrated.

First Preferred Embodiment

Figure 2:
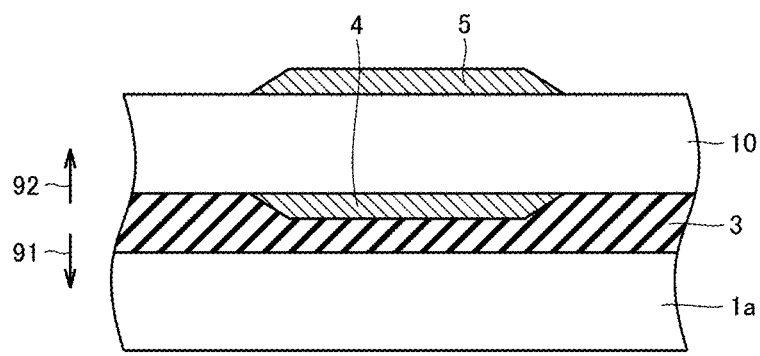
FIG. 2 is a partial enlarged view of the MEMS device according to the first preferred embodiment of the present invention.
Figure 3:
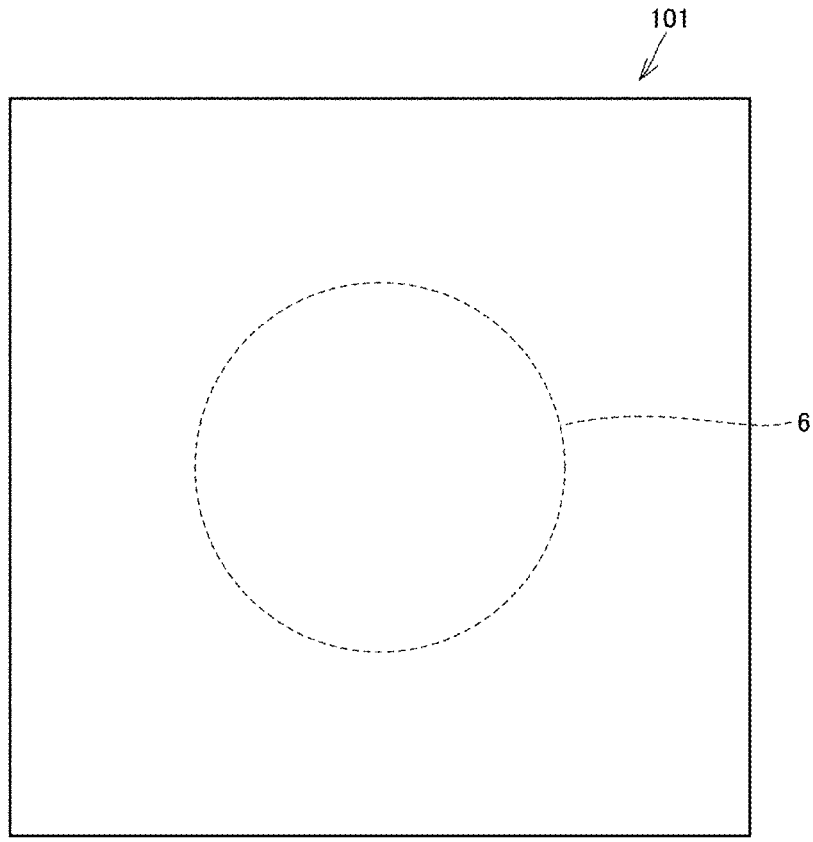
FIG. 3 is a plan view of the MEMS device according to the first preferred embodiment of the present invention.

A MEMS device according to a first preferred embodiment of the present invention will now be described with reference to FIG. 1 to FIG. 3. A cross-sectional view of a MEMS device 101 in the present preferred embodiment is illustrated in FIG. 1. A diagram resulting from enlargement of the vicinity of a lower electrode 4 and an upper electrode 5 in FIG. 1 is illustrated in FIG. 2. The MEMS device 101 viewed from above is illustrated in FIG. 3.

The MEMS device 101 includes a membrane portion 6. The membrane portion 6 is thin and is likely to be deformed in the MEMS device 101. In the example illustrated in FIG. 1, a substrate 1 includes a thin portion 1e and a thick portion 1f. The thin portion 1e is thinner than the thick portion 1f and is more likely to be deformed, as compared with the thick portion 1f. When the MEMS device 101 is viewed from below, the thin portion 1e is surrounded by the thick portion 1f. In the example illustrated in FIG. 1, the membrane portion 6 includes the thin portion 1e. Providing the thin portion 1e in an area surrounded by the thick portion 1f produces the substrate 1 including a space 21.

The MEMS device 101 includes a piezoelectric layer 10 made of a piezoelectric single crystal, a lower electrode 4 that is a first electrode and that is provided on a surface in a first direction 91 of the piezoelectric layer 10 (a first surface of the piezoelectric layer), and an upper electrode 5 that is a second electrode and that is provided on a surface in a second direction 92 (a second surface of the piezoelectric layer), which is opposite to the first direction 91 or the first surface, of the piezoelectric layer 10. The "first direction 91" here is one of the two orientations of the laminated direction of the MEMS device 101. The first direction 91 is directed to the lower side in FIG. 1, as illustrated by an arrow and a reference numeral. Although wiring connected to the lower electrode 4 may be integrally provided with the lower electrode 4 in the lower electrode 4, the wiring is not included in the lower electrode 4. The lower electrode 4 indicates the shape of only the electrode body having the integral shape as the lower electrode 4. The same applies to the upper electrode 5. It is sufficient for the upper electrode 5 to have a shape roughly coinciding with the shape resulting from projection of the lower electrode 4 in the thickness direction of the piezoelectric layer 10, and the upper electrode 5 may not necessarily have a shape strictly coinciding with that of the lower electrode 4. The "piezoelectric material" here is preferably a single crystal material having a cleavage direction and may be, for example, $LiTaO_3$, $LiNbO_3$, ZnO, or lead magnesium niobate-lead titanate (PMN-PT).

The MEMS device 101 includes an intermediate layer 3 that is a first layer and that covers the surface in the first direction 91 of the piezoelectric layer 10. The intermediate layer 3 is an insulating layer. The intermediate layer 3 may preferably be made of, for example, $SiO_2$. The intermediate layer 3 may include multiple layers. The intermediate layer 3 may include a metal layer. In the MEMS device 101, a silicon-on-insulator (SOI) substrate, for example, is preferably used as the substrate 1. In the example illustrated in FIG. 1, the membrane portion 6 includes a portion of the piezoelectric layer 10 and a portion of the intermediate layer 3, in addition to the thin portion 1e of the substrate 1. The substrate 1 includes an active layer 1a and a base portion 1b, and an insulating film 13 is interposed between the active layer 1a and the base portion 1b.

An electrode 14 is provided, in addition to the lower electrode 4, on the bottom surface of the piezoelectric layer 10. An electrode 15 is provided, in addition to the upper electrode 5, on the top surface of the piezoelectric layer 10. Although the lower electrode 4 and the electrode 14 are illustrated in different locations in FIG. 1, the lower electrode 4 and the electrode 14 may be electrically connected to each other and may be physically connected to each other with a conductor directly or indirectly. In the example illustrated in FIG. 1, the lower electrode 4 is connected to the electrode 14 at a position that is not illustrated in the cross-sectional view. The same or substantially the same connection configuration as between the lower electrode 4 and the electrode 14 applies to the connection configuration between the upper electrode 5 and the electrode 15. Although the upper electrode 5 and the electrode 15 are illustrated in different locations in FIG. 1, the upper electrode 5 and the electrode 15 may be electrically connected to each other. In the example illustrated in FIG. 1, the upper electrode 5 is connected to the electrode 15 at a position that is not illustrated in the cross-sectional view. A through hole 18 is provided in the piezoelectric layer 10 to expose the electrode 14. The through hole 18 passes through the piezoelectric layer 10 in the thickness direction. An electrode (not illustrated) may be arranged to be connected to the electrode 14 through the inside of the through hole 18 from the top surface of the piezoelectric layer 10 near the upper end of the through hole 18. The arrangement of such an electrode enables the electrode 14 to extend to the upper side of the piezoelectric layer 10.

At least a portion of the piezoelectric layer 10 is included in the membrane portion 6. In a cross section along a plane vertical or substantially vertical to the surface in the first direction 91, each of the lower electrode 4, which is the first electrode, and the upper electrode 5, which is the second electrode, has a tapered cross-sectional shape with a width which decreases with increasing distance from the piezoelectric layer 10. The electrodes 14 and 15 may also each have a tapered cross-sectional shape.

As illustrated in FIG. 3, although the membrane portion 6 has a circular or substantially circular shape in a plan view in the example illustrated here, the shape of the membrane portion 6 in a plan view is not limited to a circle and the membrane portion 6 may have a square or substantially square shape, a rectangular or substantially rectangular shape, or a polygonal or substantially polygonal shape. Although the upper electrode 5 is originally provided in a certain pattern on the top surface of the piezoelectric layer 10, the illustration of the upper electrode 5 is omitted in FIG. 3. Although an example in which no slit is provided is described as the MEMS device 101, one or more slits may be provided in the membrane portion 6 in a plan view. The slits may be, for example, intermittently provided along the outline of the membrane portion 6 in a plan view.

In the present preferred embodiment, the upper electrode 5, which is the second electrode, is provided in an area coinciding or substantially coinciding with the area of the lower electrode 4, which is the first electrode, and the shapes of the two electrodes sandwiching the piezoelectric layer 10 are symmetrical or substantially symmetrical to each other in a cross-sectional view. Accordingly, the structure of the portion that vibrates has vertical symmetry or substantial vertical symmetry to increase the efficiency of vibration. Consequently, the device characteristics are improved.

In the present preferred embodiment, the piezoelectric layer 10 is able to be deformed by providing a voltage difference between the upper electrode 5 and the lower electrode 4 to cause bending vibration of the membrane portion 6. Alternatively, the bending vibration occurring in the membrane portion 6 due to externally exerted force is able to be extracted as an electrical signal between the upper electrode 5 and the lower electrode 4. In the present preferred embodiment, the bending vibration preferably occurs in the membrane portion 6. The MEMS device 101 may be, for example, a piezoelectric micromachined ultrasonic transducer (PMUT) using the bending vibration.

In the present preferred embodiment, the upper electrode 5, which is the second electrode, preferably corresponds to the projection area of the lower electrode 4, which is the first electrode. In other words, the upper electrode 5 is preferably provided in the projection area of the lower electrode 4. Also, the upper electrode 5 overlaps with the lower electrode 4. The word "overlap" includes not only such case in which an entire or substantially an entire portion of one thing is overlapping with an entire or substantially an entire portion of another thing, but also such case in which at least a portion of one thing is overlapping with at least a portion of another thing. Alternatively, the second electrode preferably has the same or substantially the same area as that of the first electrode. The "same area or substantially same area" has an allowance of about ±5%, for example. Since this configuration further increases the symmetry between the shapes of the two electrodes sandwiching the piezoelectric layer in a cross-sectional view, the efficiency of vibration is further increased. In addition, since the symmetry between the shapes of the two electrodes sandwiching the piezoelectric layer is high, non-uniform strain is not caused by film stress such that the reliability of the device is improved. In the example according to the present preferred embodiment, the shape resulting from projection of the outline of the lower electrode 4 in the thickness direction of the piezoelectric layer 10 substantially coincides with the outline of the upper electrode 5.

The lower electrode 4, which is the first electrode, and the upper electrode 5, which is the second electrode, are preferably epitaxial growth layers, for example. This configuration improves the electric power handling capability.

The configuration is exemplified in the present preferred embodiment, in which the substrate 1 includes the thin portion 1e and the membrane portion 6 includes the thin portion 1e. However, a configuration may be provided, in which the substrate 1 does not include the thin portion 1e. In other words, a configuration may be provided, in which the thickness of the thin portion 1e is zero. In this case, the membrane portion 6 does not include the thin portion 1e of the substrate 1. Even in this case, the membrane portion 6 includes a portion of the piezoelectric layer 10 and a portion of the intermediate layer 3. The intermediate layer 3 may be exposed from the bottom surface of the membrane portion 6.

Manufacturing Method

A method of manufacturing the MEMS device 101 according to the present preferred embodiment will now be described with reference to FIG. 4 to FIG. 9.

Figure 4:
FIG. 4 is an explanatory diagram of a first process of a method of manufacturing the MEMS device according to the first preferred embodiment of the present invention.
Figure 5:
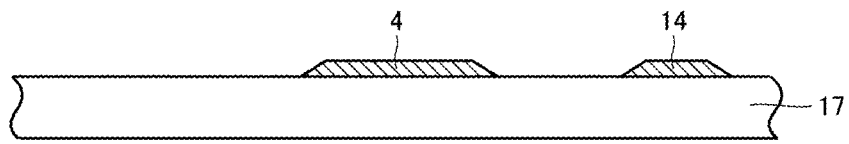
FIG. 5 is an explanatory diagram of a second process of the method of manufacturing the MEMS device according to the first preferred embodiment of the present invention.

First, as illustrated in FIG. 4, a piezoelectric single crystal substrate 17 is prepared. The piezoelectric single crystal substrate 17 may preferably be, for example, a substrate made of LiTaO$_3$ or LiNbO$_3$. Next, as illustrated in FIG. 5, the lower electrode 4 and the electrode 14 are formed through film formation into a desired pattern on one surface of the piezoelectric single crystal substrate 17. The lower electrode 4 and the electrode 14 may preferably be made of, for example, Pt or the like. For example, a Ti layer, which defines and functions as a close contact layer, may be interposed on the interface between the piezoelectric single crystal substrate 17 and the lower electrode 4 and the electrode 14. The patterning is performed so that the outer peripheries of the lower electrode 4 and the electrode 14 are inclined, as illustrated in FIG. 5. The conditions of etching used in the patterning are appropriately adjusted to perform the etching so that the outer peripheries are reliably inclined.

Figure 6:
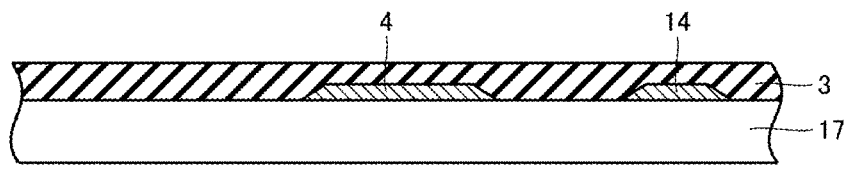
FIG. 6 is an explanatory diagram of a third process of the method of manufacturing the MEMS device according to the first preferred embodiment of the present invention.

As illustrated in FIG. 6, the intermediate layer 3 is formed so that the lower electrode 4 is covered with the intermediate layer 3. The intermediate layer 3 may preferably be made of, for example, SiO$_2$ or the like. After the intermediate layer 3 is formed, the surface of the intermediate layer 3 is flattened through chemical mechanical polishing (CMP), for example.

Figure 7:
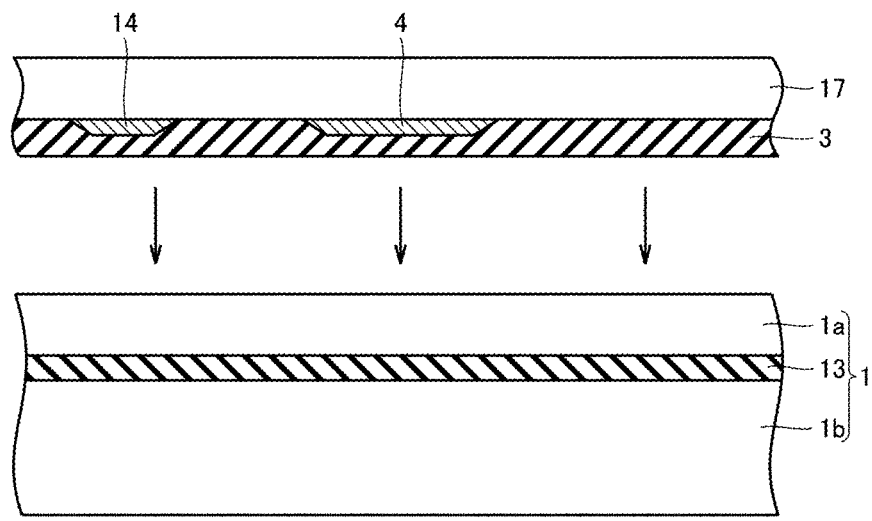
FIG. 7 is an explanatory diagram of a fourth process of the method of manufacturing the MEMS device according to the first preferred embodiment of the present invention.
Figure 8:
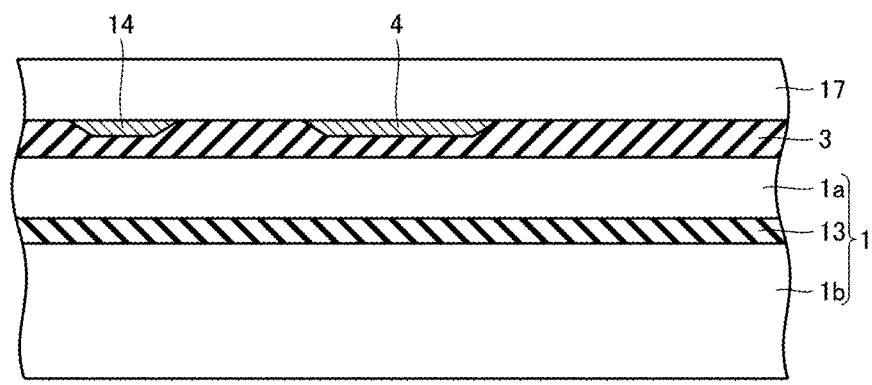
FIG. 8 is an explanatory diagram of a fifth process of the method of manufacturing the MEMS device according to the first preferred embodiment of the present invention.

As illustrated in FIG. 7, the above structure is bonded to the substrate 1. The bonding is performed so that the intermediate layer 3 is in contact with the substrate 1. The bonding results are illustrated in FIG. 8. A metal layer may be interposed on the interface with which the intermediate layer 3 is joined to the substrate 1. The substrate 1 may preferably be a silicon substrate, for example. An intermediate layer may be provided in the substrate 1. The intermediate layer 3 may be formed through thermal oxidation of a portion of the substrate 1, for example.

Figure 9:
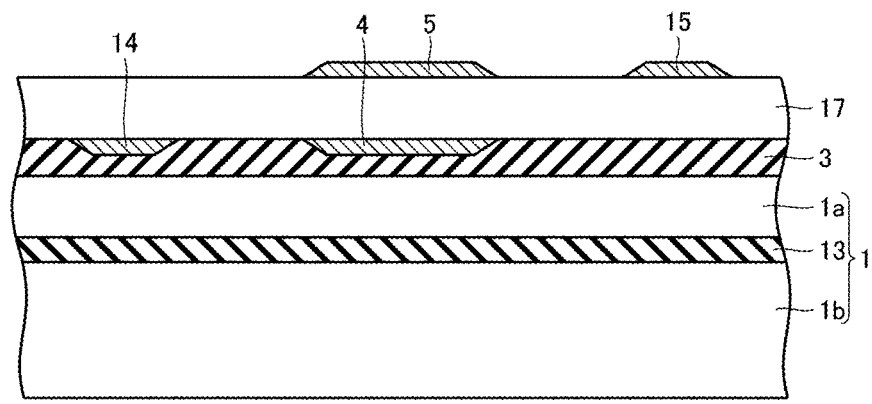
FIG. 9 is an explanatory diagram of a sixth process of the method of manufacturing the MEMS device according to the first preferred embodiment of the present invention.

As illustrated in FIG. 9, the upper electrode 5 is formed through the film formation into a desired pattern on the top surface of the piezoelectric single crystal substrate 17. The upper electrode 5 may preferably be made of, for example, Pt or the like. For example, a Ti layer, which defines and functions as the close contact layer, may be interposed on the interface between the piezoelectric single crystal substrate 17 and the upper electrode 5 and the electrode 15. The patterning is performed so that the outer peripheries of the upper electrode 5 and the electrode 15 are inclined, as illustrated in FIG. 9. The conditions of the etching used in the patterning are appropriately adjusted to perform the etching so that the outer peripheries are reliably inclined.

The piezoelectric single crystal substrate 17, the intermediate layer 3, and the substrate 1 are formed into desired patterns. A portion of the base portion 1b of the substrate 1 is removed by, for example, deep reactive-ion etching (DRIE) to form the membrane portion 6. In addition, the insulating film 13 is removed on the bottom surface of the membrane portion 6 to manufacture the MEMS device 101 illustrated in FIG. 1. A structure may be provided, in which the insulating film 13 remains on the bottom surface of the membrane portion 6. An electrode to electrically extract the electrode 14 to the top surface of the piezoelectric layer 10 may be formed in the through hole 18, if needed.

Second Preferred Embodiment

Figure 10:
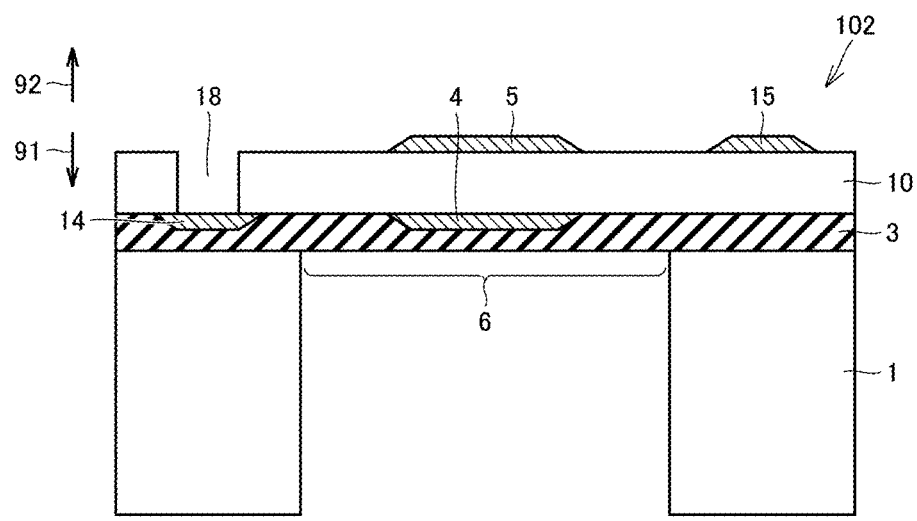
FIG. 10 is a cross-sectional view of a MEMS device according to a second preferred embodiment of the present invention.
Figure 11:
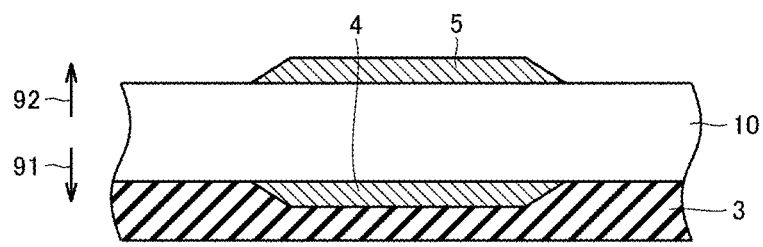
FIG. 11 is a partial enlarged view of the MEMS device according to the second preferred embodiment of the present invention.

A MEMS device according to a second preferred embodiment of the present invention will now be described with reference to FIG. 10 to FIG. 11. A cross-sectional view of a MEMS device 102 in the present preferred embodiment is illustrated in FIG. 10. A diagram resulting from enlargement of the vicinity of the lower electrode 4 and the upper electrode 5 in FIG. 10 is illustrated in FIG. 11. The MEMS device 102 is a MEMS device in which the membrane portion 6 uses bulk waves. The MEMS device 102 includes the lower electrode 4, the upper electrode 5, and the electrodes 14 and 15, similar to the MEMS device 101 described in the first preferred embodiment. On a cross section along a plane vertical or substantially vertical to the surface in the first direction 91, each of the lower electrode 4, which is the first electrode, and the upper electrode 5, which is the second electrode, has a tapered cross-sectional shape with a width which decreases with increasing distance from the piezoelectric layer 10, as in the first preferred embodiment. Also in the MEMS device 102, the piezoelectric layer 10 includes the through hole 18, similar to the MEMS device 101.

In the MEMS device 102, a silicon substrate, for example, is preferably used as the substrate 1, instead of the SOI substrate. The insulating film 13 is not included in the substrate 1 of the MEMS device 102. The intermediate layer 3 is exposed to define the bottom surface of the membrane portion 6.

Also in the present preferred embodiment, the upper electrode 5, which is the second electrode, is provided in an area coinciding or substantially coinciding with the area of the lower electrode 4, which is the first electrode, and the shapes of the two electrodes sandwiching the piezoelectric layer 10 are symmetrical or substantially symmetrical to each other in a cross-sectional view. Accordingly, the structure of the portion that vibrates is close to the vertical symmetry or substantially vertical symmetry to increase the efficiency of vibration and improve the resonance characteristics. Consequently, the device characteristics are improved. Furthermore, the electrode structure of the portion that vibrates is in a state close to the vertical symmetry or substantially vertical symmetry and non-uniform strain is not caused by film stress. Accordingly, cracking is less likely to occur in the piezoelectric material to improve the reliability of the device.

Multiple preferred embodiments, among the above-described preferred embodiments, may be appropriately combined.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A micro electro mechanical systems device comprising:
   a piezoelectric layer made of a piezoelectric single crystal;
   a first electrode on a first surface of the piezoelectric layer;
   a second electrode on a second surface, which is opposite to the first surface, of the piezoelectric layer;
   a third electrode on the first surface of the piezoelectric layer and a fourth electrode on the second surface of the piezoelectric layer; and
   a first layer covering the first surface of the piezoelectric layer; wherein
   at least a portion of the piezoelectric layer is included in a membrane portion; and
   each of the first electrode and the second electrode has a tapered cross-sectional shape with a width which decreases with increasing distance from the piezoelectric layer on a cross section along a plane vertical or substantially vertical to the first surface.

2. The micro electro mechanical systems device according to claim 1, wherein the second electrode is overlapped with the first electrode when the micro electro mechanical systems device is viewed in a thickness direction.

3. The micro electro mechanical systems device according to claim 1, wherein the second electrode is provided in a projection area of the first electrode.

4. The micro electro mechanical systems device according to claim 1, wherein the second electrode has a same or substantially a same area as that of the first electrode.

5. The micro electro mechanical systems device according to claim 1, wherein the first electrode and the second electrode are epitaxial growth layers.

6. The micro electro mechanical systems device according to claim 1, wherein micro electro mechanical systems device is configured such that bending vibration occurs in the membrane portion.

7. The micro electro mechanical systems device according to claim 1, wherein the membrane portion utilizes bulk waves.

8. The micro electro mechanical systems device according to claim 1, wherein the membrane portion is configured to deform more than the remaining portion.

9. The micro electro mechanical systems device according to claim 1, wherein the piezoelectric layer includes at least one of $LiTaO_3$, $LiNbO_3$, ZnO, or lead magnesium niobate-lead titanate.

10. The micro electro mechanical systems device according to claim 1, wherein the first layer is made of $SiO_2$.

11. The micro electro mechanical systems device according to claim 1, further comprising a substrate on which the piezoelectric layer is provided.

12. The micro electro mechanical systems device according to claim 11, wherein the substrate is a silicon-on-insulator substrate.

13. The micro electro mechanical systems device according to claim 11, wherein
   the substrate includes an active portion and a base portion; and
   an insulating layer is interposed between the active portion and the base portion.

14. The micro electro mechanical systems device according to claim 1, wherein the membrane portion has a circular or substantially circular shape.

15. The micro electro mechanical systems device according to claim 1, wherein the piezoelectric layer includes a through hole that exposes the third electrode.

16. The micro electro mechanical systems device according to claim 1, wherein each of the third electrode and the fourth electrode has a tapered cross-sectional shape with a width which decreases with increasing distance from the piezoelectric layer on a cross section along a plane vertical or substantially vertical to the first surface.

17. The micro electro mechanical systems device according to claim 11, wherein the substrate includes a thick portion and a thin portion that is thinner than the thick portion.

18. A micro electro mechanical systems device comprising:
   a piezoelectric layer made of a piezoelectric single crystal;
   a first electrode on a first surface of the piezoelectric layer;
   a second electrode on a second surface, which is opposite to the first surface, of the piezoelectric layer; and
   a first layer covering the first surface of the piezoelectric layer; wherein
   at least a portion of each of the piezoelectric layer and the first layer is included in a membrane portion;
   a thickness of the first layer in the membrane portion is less than a thickness of the first layer outside of the membrane portion; and
   each of the first electrode and the second electrode has a tapered cross-sectional shape with a width which decreases with increasing distance from the piezoelectric layer on a cross section along a plane vertical or substantially vertical to the first surface.

* * * * *